(12) United States Patent
Petrmichl et al.

(10) Patent No.: US 6,610,360 B2
(45) Date of Patent: Aug. 26, 2003

(54) BUFFING DIAMOND-LIKE CARBON (DLC) TO IMPROVE SCRATCH RESISTANCE

(75) Inventors: Rudolph Hugo Petrmichl, Ann Arbor, MI (US); Fabio Reis, Belleville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 09/994,922

(22) Filed: Nov. 28, 2001

(65) Prior Publication Data

US 2003/0099835 A1 May 29, 2003

(51) Int. Cl.[7] ............................ C23C 16/26; B05D 3/12
(52) U.S. Cl. .................................... 427/249.7; 427/355
(58) Field of Search ............................ 427/249.7, 368, 427/355

(56) References Cited

U.S. PATENT DOCUMENTS

| | | |
|---|---|---|
| 5,378,527 A | 1/1995 | Nakanishi et al. |
| 5,470,661 A * | 11/1995 | Bailey et al. ............... 428/408 |
| 5,508,092 A | 4/1996 | Kimock et al. |
| 5,637,353 A | 6/1997 | Kimock et al. |
| 5,718,976 A | 2/1998 | Dorfman et al. |
| 5,770,321 A | 6/1998 | Hartig et al. |
| 5,800,918 A | 9/1998 | Chartier et al. |
| 5,858,477 A | 1/1999 | Veerasamy et al. |
| 5,888,593 A | 3/1999 | Petrmichl et al. |
| 6,046,758 A | 4/2000 | Brown et al. |
| 6,171,646 B1 * | 1/2001 | Gerhardinger ............... 427/166 |
| 6,273,488 B1 | 8/2001 | Pike et al. |
| 6,277,480 B1 | 8/2001 | Veerasamy et al. |
| 6,280,834 B1 | 8/2001 | Veerasamy et al. |
| 6,284,377 B1 | 9/2001 | Veerasamy |
| 6,303,225 B1 | 10/2001 | Veerasamy |
| 6,303,226 B2 | 10/2001 | Veerasamy |
| 6,447,891 B1 * | 9/2002 | Veerasamy et al. ......... 428/408 |

OTHER PUBLICATIONS

"Electronic Density of States in Highly Tetrahedral Amorphous Carbon", Veerasamy et al., XP 002041954, No date, pp. 319–326.
"Preparation and Properties of Highly Tetrahedral Hydrogenated Amorphous Carbon", Weiler et al., XP 002041955, Jan. 1996, pp. 1594–1607. PhysRev B vol. 53 No. 3.
"Optical and Electronic Properties of Amorphous Diamond", Veerasamy et al., Apr. 1993, pp. 782–787.
"Deposition of Carbon Films by a Filtered Cathodic Arc", Kuhn et al., Aug. 1993, pp. 1350–1354.
Properties of Ion Beam Deposited Tetrahedral Fluorinated Amorphous Carbon Films (ta–C:F), Ronning et al. pp 335–340, 2000.
"Gaseous Precursors of Diamond–Like Carbon Films: Chemical Composition of $CH_4$/Ar Plasmas", Riccardi et al., pp. 211–215, Vacuum 61 (2001).

* cited by examiner

Primary Examiner—Bret Chen
(74) Attorney, Agent, or Firm—Nixon & Vanderhye P.C.

(57) ABSTRACT

Scratch resistance (SR) of a coated article is improved by buffing the coated article after deposition of the layer(s) of the coating. For example, in certain embodiments a diamond-like carbon (DLC) inclusive layer(s) is deposited on a substrate (directly or indirectly), and thereafter buffed in order to improve its scratch resistance.

24 Claims, 4 Drawing Sheets

BUFFING DIAMOND-LIKE CARBON (DLC) TO IMPROVE SCRATCH RESISTANCE

This invention relates to a method of buffing a diamond-like carbon (DLC) inclusive layer in order to improve scratch resistance (SR) of the same, and to the resulting coated article. The DLC inclusive layer may be provided either directly on a substrate (e.g., glass or plastic substrate), or alternatively on the substrate over top of another layer or coating system such as a low-E (low-emissivity) coating system.

BACKGROUND OF THE INVENTION

It is known to provide diamond-like carbon (DLC) inclusive coatings on substrates for scratch resistance purposes. For example, see commonly owned U.S. Pat. Nos. 6,303,226 and 6,277,480, the disclosures of which are hereby incorporated herein by reference. The DLC inclusive coatings of the aforesaid patent provide good scratch resistance (SR) characteristics. However, there may in some instances be room for improvement in this regard.

In view of the above, there may in certain instances be a need in the art for a technique for even further improving scratch resistance (SR) characteristics of a coating (e.g., a coating including at least one DLC inclusive layer).

It is a purpose of different embodiments of this invention to fulfill any or all of the above described need(s) in the art, and/or other need(s) which will become apparent to the skilled artisan once given the following disclosure.

SUMMARY OF THE INVENTION

An object of this invention is to provide a durable coated article that can be used in applications such as automotive windows (e.g., automotive windshields, side windows, or backlites), table tops, architectural windows, bathroom shower windows/doors, coated ceramic tile, and the like.

Another object of this invention is to provide a such a durable coated article having good scratch resistance (SR) characteristics.

Another object of this invention is to provide a method of making a layer(s) system or coating including diamond-like carbon (DLC) in a manner so as to improve SR characteristics of the layer(s) or coating system. The DLC inclusive layer(s) system or coating may be hydrophobic, hydrophilic, or neither in different embodiments of this invention.

Yet another object of this invention is to fulfill one or more of the aforesaid objects and/or needs.

In certain example embodiments of this invention, one or more of the above-listed objects and/or needs is/are fulfilled by providing a method of making a coated article, the method comprising:

depositing a diamond-like carbon (DLC) inclusive coating on a substrate; and buffing the DLC inclusive coating to an extent so that scratch resistance of the coating improves at least 3%.

In other example embodiments of this invention, one or more of the above-listed objects and/or needs is/are fulfilled by providing a method of making a coated article, the method comprising:

depositing a diamond-like carbon (DLC) inclusive layer on a substrate; and buffing the DLC inclusive layer to an extent so that scratch resistance of the DLC inclusive layer improves.

In other example embodiments of this invention, one or more of the above-listed objects and/or needs is/are fulfilled by providing a method of making a coated article, the method comprising:

depositing a layer on a substrate; and mechanically buffing the layer so that scratch resistance of the layer improves.

In other example embodiments of this invention, one or more of the above-listed objects and/or needs is/are fulfilled by providing a coated article comprising:

a substrate;

a DLC inclusive layer on the substrate; and wherein the DLC inclusive layer is buffed.

IN THE DRAWINGS

DETAILED DESCRIPTION OF CERTAIN EMBODIMENTS OF THIS INVENTION

Figure 1A:
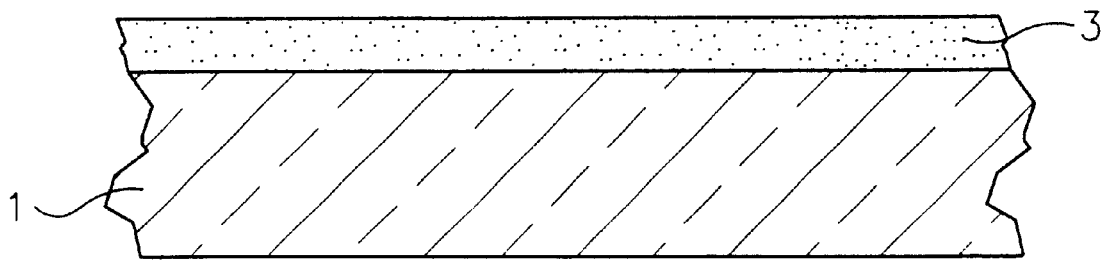
FIG. 1(a) is a side cross sectional view of a coated article according to an embodiment of this invention.

Referring now more particularly to the accompanying drawings in which like reference numerals indicate like elements throughout the accompanying views.

The instant invention relates to a method/technique for buffing (or rubbing) a coated article in order to improve scratch resistance (SR) characteristics thereof. Surprisingly, it has been found that rubbing a coating (e.g., a coating including one or more DLC inclusive layers) improves SR characteristics thereof. Since DLC is a hard coating often used for durability reasons, improve of SR characteristics of a DLC inclusive layer is a significant desired improvement in the art.

FIG. 1(a) is a side cross sectional view of a coated article according to an embodiment of this invention, wherein a diamond-like carbon (DLC) inclusive layer(s) 3 is provided directly on and in contact with substrate 1. Substrate 1 may be of glass, plastic, ceramic, or the like in different embodiments of this invention. In certain embodiments, DLC inclusive layer 3 includes at least some amount of highly tetrahedral amorphous carbon (ta-C). Highly tetrahedral amorphous carbon (ta-C) forms $sp^3$ carbon-carbon bonds, and is a special form of diamond-like carbon (DLC). Layer 3 may be hydrogenated in certain example embodiments of this invention (i.e., ta-C:H). In certain embodiments, the DLC inclusive layer 3 may be doped (e.g., with Si, B, P, F, and/or the like).

In general, the DLC inclusive layer 3 provides durability (e.g., scratch resistance). In different embodiments of this invention, DLC inclusive layer 3 may be hydrophobic (i.e., high contact angle θ), hydrophilic (low contact angle θ), or neither. In hydrophobic embodiments, the coated article may have a contact angle θ of at least about 80 degrees, more preferably at least about 100 degrees; whereas in hydrophilic embodiments the coated article may have a contact angle θ of less than or equal to about 15 degrees, more preferably less than or equal to about 10 degrees (initially or otherwise).

DLC inclusive layer 3 may be deposited on substrate 1 in any suitable manner. For example, and without limitation, DLC inclusive layer 3 may be ion beam deposited on substrate 1 in any of the manners described in any of commonly owned U.S. Pat. Nos. 6,280,834, 6,303,226, 6,277,480, 6,303,225, or 6,273,488, all of which are incorporated herein by reference. In certain example embodiments, DLC inclusive layer(s) 3 may be ion beam deposited on substrate 1 using at least a precursor or feedstock gas(es) such as $C_2H_2$ (acetylene), TMS (tetramethylsilane), or any other suitable gas(es). In certain embodiments, the gas and/or gas distribution may vary throughout the ion beam deposition of layer 3 so that the layer 3 has different characteristics (e.g., density, hardness, etc.) at different points in its thickness. In certain exemplary embodiments of this invention, layer 3 may have an average hardness (measured via a nano-indentation hardness measuring technique) of at least 10 GPa, more preferably at least 20 GPa, and most preferably at least 40 GPa.

DLC inclusive layer 3 may be from about 5–250 angstroms (Å) thick in certain embodiments of this invention, more preferably from about 10–200 Å thick, and most preferably from about 10–100 Å thick. Because the buffing (to be described in detail below) improves the scratch resistance (SR) of layer 3, the layer 3 can be made thinner than otherwise possible while achieving the same overall hardness and/or SR; and because the layer 3 is thinner visible transmission of the resulting coating article can be increased which is desirable in certain embodiments of this invention.

In certain embodiments, DLC inclusive layer 3 may have an approximately uniform distribution of $sp^3$ carbon-carbon bonds throughout a large portion of its thickness, so that much of the layer 3 has approximately the same density. In other embodiments, the distribution of $sp^3$ carbon-carbon bonds may vary throughout the thickness of the layer 3 (e.g., when different gas(es) and/or different energies are used in ion beam depositing different portions of the layer). In certain example embodiments of this invention, in DLC inclusive layer 3 at least about 40% (more preferably at least about 60%, and most preferably at least about 80%) of the carbon-carbon bonds are of the $sp^3$ carbon-carbon type (as opposed for example to the $sp^2$ carbon-carbon type). Thus, in certain preferred embodiments, layer 3 has more $sp^3$ carbon-carbon type bonds than $sp^2$ carbon-carbon type bonds. In certain embodiments of this invention, DLC inclusive layer 3 has a density of from about 2.4 to 3.4 gm/cm$^3$, more preferably from about 2.7 to 3.0 gm/cm$^3$.

Figure 1B:
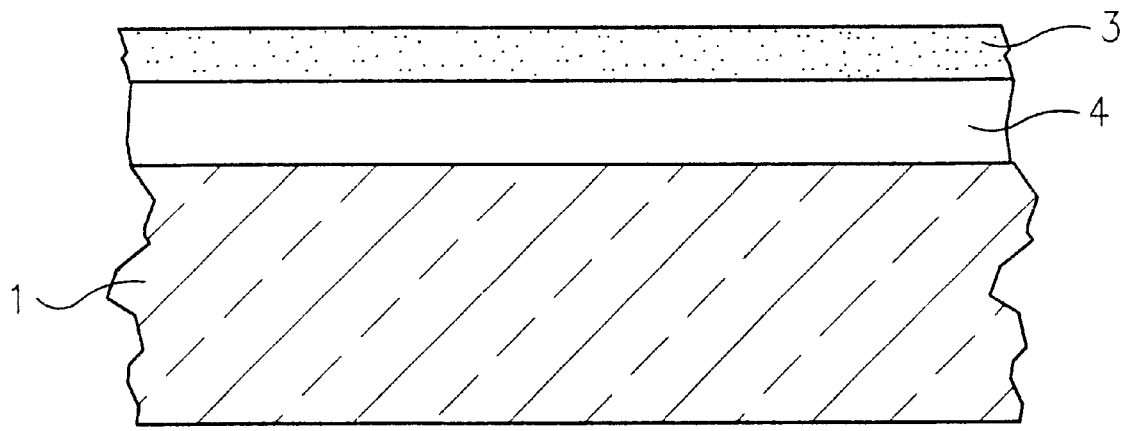
FIG. 1(b) is a side cross sectional view of a coated article according to another embodiment of this invention.

FIG. 1(b) is a cross sectional view of a coated article according to another embodiment of this invention. While FIG. 1(a) illustrates DLC inclusive layer 3 deposited directly onto and in contact with substrate 1, the Figure 1(b) embodiment illustrates DLC inclusive layer 3 deposited/formed on substrate 1 but over another coating 4 including one or more layers; otherwise, the embodiments are the same.

In the FIG. 1(b) embodiment, intermediate layer(s) 4 may be of or include, for example, any of silicon nitride, silicon oxide, an infrared (IR) reflecting layer or layer system, an ultraviolet (UV) reflecting layer or layer system, another DLC inclusive layer(s), or any other type of desired layer(s). In this embodiment, it is noted that layer 3 is still "on" and "supported by" substrate 1, and the coating now includes both layer 3 and layer(s) 4. Exemplar coatings/layers that may be used as low-E or other coating(s)/layer(s) 4 are shown and/or described in any of U.S. Pat. Nos. 5,837,108, 5,800,933, 5,770,321, 5,557,462, 5,514,476, 5,425,861, 5,344,718, 5,376,455, 5,298,048, 5,242,560, 5,229,194, 5,188,887 and 4,960,645, which are all hereby incorporated herein by reference. Low-E or solar control coatings 4 of these patents may be sputter-coated on substrate 1, and thereafter DLC inclusive layer(s) 3 may be ion beam deposited on the substrate 1 over the layer(s) 4. Each of these patents discloses at least an IR reflective coating or layer system including an IR reflecting layer such as Ag, NiCr or the like. Thus, for example and without limitation, coating 4 may comprise at least an Ag layer, an NiCr layer, and/or a dielectric layer such as silicon nitride.

In each of the FIGS. 1(a)–(b) embodiments, the resulting coated article is at least about 30% transmissive of visible light, more preferably at least about 65%, even more preferably at least about 70%, and most preferably at least about 75% transmissive to visible light. In a similar manner, layer 3 is of a thickness so that it is preferably at least about 70% transmissive of visible light, more preferably at least about 80%, and most preferably at least about 90% transmissive of visible light.

Figure 3:
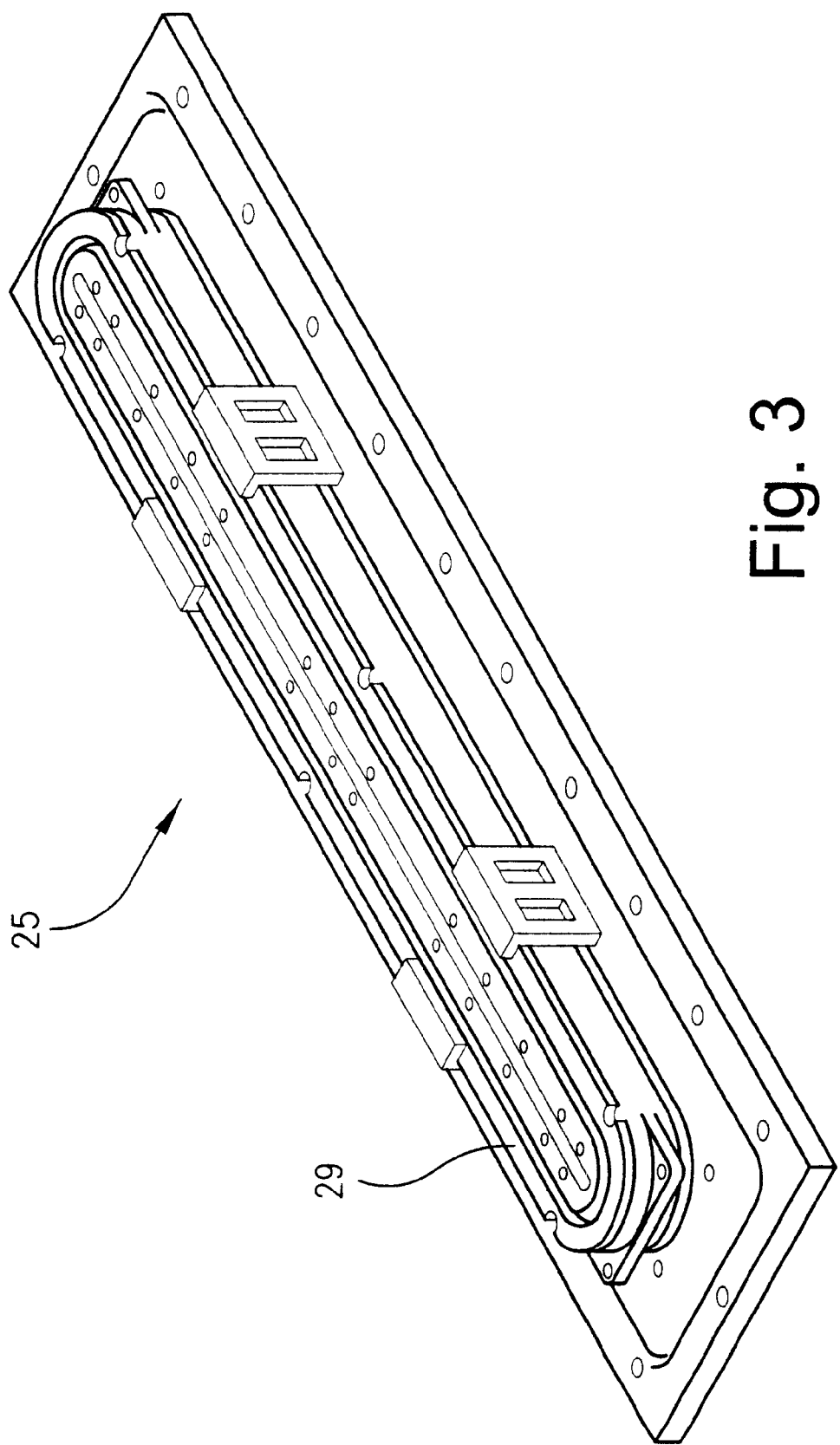
FIG. 3 is a perspective view of a linear ion beam source which may be used in any embodiment of this invention for depositing DLC inclusive layer(s).
Figure 4:
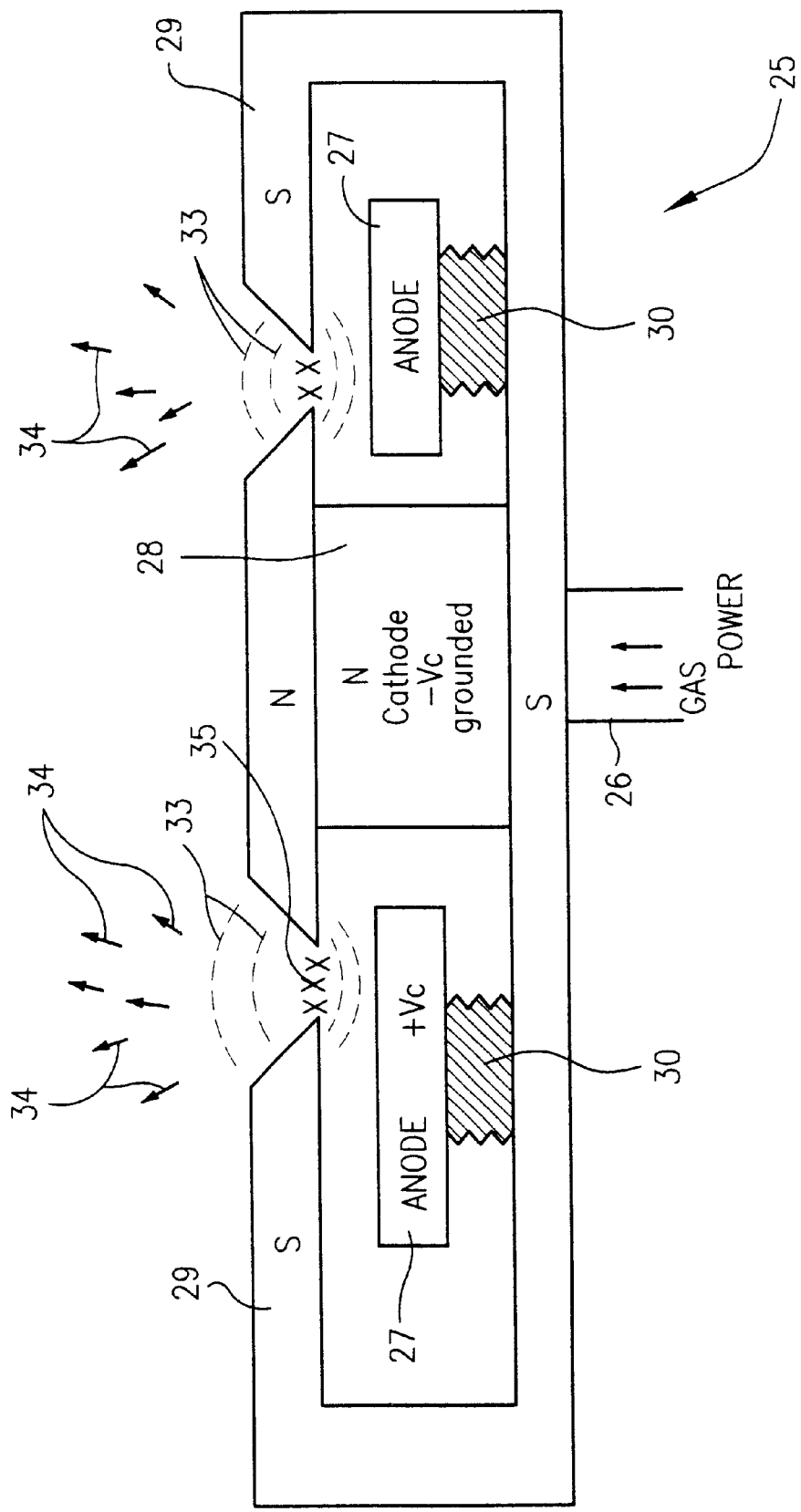
FIG. 4 is a cross sectional view of the linear ion beam source of FIG. 3.

FIGS. 3–4 illustrate an exemplary linear or direct ion beam source 25 which may be used to deposit layer 3, clean or ion beam mill a substrate, or surface plasma treat a DLC inclusive coating with H and/or F according to different embodiments of this invention. Ion beam source 25 includes gas/power inlet 26, anode 27, grounded cathode magnet portion 28, magnet poles 29, and insulators 30. A 3 kV DC power supply may be used for source in some embodiments. Linear source ion deposition allows for substantially uniform deposition of layer 3 as to thickness and stoichiometry. Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The magnetic field configuration further gives rise to an anode layer that allows the linear ion beam source to work absent any electron emitter. The anode layer ion source can also work in a reactive mode (e.g. with oxygen and nitrogen). The source includes a metal housing with a slit in a shape of a race track as shown in FIGS. 3–4. The hollow housing is at ground potential. The anode electrode is situated within the cathode body (though electrically insulated) and is positioned just below the slit. The anode can be connected to a positive potential as high as 3,000 or more volts (V). Both electrodes may be water cooled in certain embodiments. Feedstock/precursor gases, described herein, are fed through the cavity between the anode and cathode. The gas(es) used determines the make-up of the resulting layer 3 deposited on an adjacent substrate 1.

The linear ion source 25 also contains a labyrinth system that distributes the precursor gas (e.g., dimethylsilane; acetylene (i.e., $C_2H_2$); 3MS (i.e., trimethyldisilane); DMS (i.e., dichloro-dimethylsilane); HMDSO (i.e., hexamethyldisiloxane); TEOS (i.e., tetraethoxysilane), etc.) fairly evenly along its length before it expands into the anode-cathode space internally. The electrical energy then cracks the gas to produce a plasma within the source. The ions are expelled out at energies in the order of eVc-a/2 when the voltage is Vc-a. The ion beam emanating from the slit is approximately uniform in the longitudinal direction and has a Gaussian profile in the transverse direction. Exemplary ions 34 are shown in FIG. 4. A source as long as 0.2 to 4.0 meters may be made, although sources of different lengths are anticipated in different embodiments of this invention. Finally, electron layer 35 is shown in FIG. 4 completes the circuit thereby enabling the ion beam source to function properly.

Figure 2:
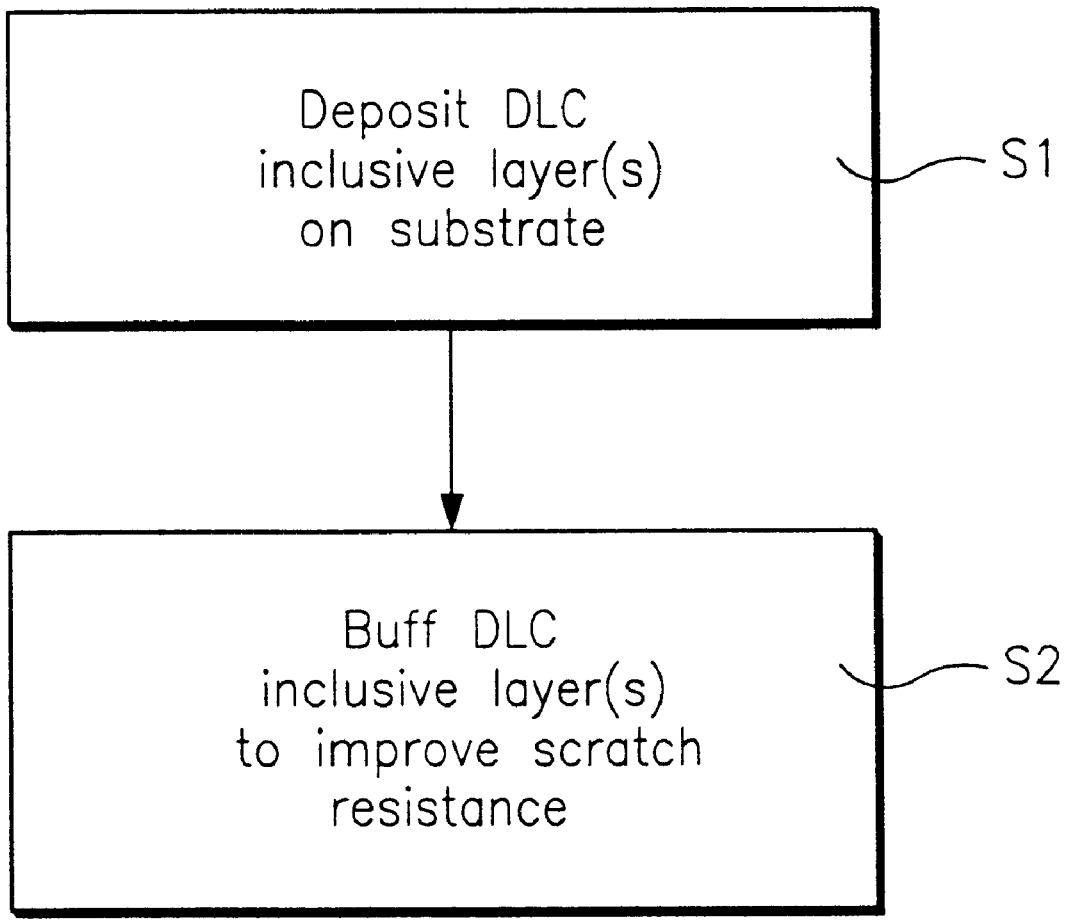
FIG. 2 is a flowchart illustrating certain steps taken in making a coated article according to certain embodiments of this invention.

In alternative embodiments of this invention, an ion beam source device or apparatus as described and shown in FIGS. 1–3 of U.S. Pat. No. 6,002,208 (hereby incorporated herein by reference in its entirety) may be used to deposit/form DLC inclusive layer 3 on substrate 1 in accordance with either the FIG. 1 or FIG. 2 embodiment of this invention. One or multiple such ion beam source devices may be used. In certain example embodiments, an ion beam source (the same as used to deposit layer 3, or a separate one) may be used to ion beam mill substrate 1 (e.g., using Ar gas) prior to deposition of layer 3.

Referring to FIGS. 1 and 3–4, an exemplary method of depositing a layer 3 on substrate 1 will now be described with respect to the FIG. 1(a) embodiment of this invention. This method is for purposes of example only, and is not intended to be limiting.

Prior to coating system 5 being formed on glass substrate 1, the top surface of substrate 1 may be cleaned or milled by way of a first linear or direct ion beam source. For example, a glow discharge in argon (Ar) gas or mixtures of $Ar/O_2$ (alternatively $CF_4$ plasma) may be used to remove any impurities on the substrate surface. Such interactions are physio-chemical in nature. This cleaning creates free radicals on the substrate surface that subsequently can be reacted with other monomers yielding substrate surfaces with specialized properties. The power used may be from about 100–300 Watts. Substrate 1 may also be cleaned by, for example, sputter cleaning the substrate prior to actual deposition of coating system 5; using oxygen and/or carbon atoms at an ion energy of from about 800 to 1200 eV, most preferably about 1,000 eV.

After cleaning, the deposition process begins using a linear ion beam deposition technique via second ion beam source as shown in FIGS. 3–4, or in FIGS. 1–3 of the '208 patent; with a conveyor having moved the cleaned substrate 1 from first source to a position under the second source. The second ion beam source functions to deposit a DLC inclusive layer 3 on substrate 1 as a gas such as at least $C_2H_2$ is fed through the source so that the source expels the ions necessary to form layer 3 on substrate 1. The $C_2H_2$ gas may be used alone, or with one or more other gas(es) (or another gas(es) may be used instead, such as ethane, methane, butane, cyclohexane, and/or mixtures thereof). Acetylene feedstock gas ($C_2H_2$) is used in certain embodiments for depositing layer 3 to prevent or minimize/reduce polymerization, and/or to obtain an appropriate energy to allow the ions to penetrate the surface of the substrate 1 and subimplant therein. The optimal ion energy window for the majority of layer 3 is from about 100–2,000 eV per carbon ion. At these energies, the carbon in the resulting layer 3 emulates diamond, and $sp^3$ C—C bonds form.

While direct ion beam deposition techniques are preferred in certain embodiments, other methods of deposition may also be used in different embodiments. For example, filtered cathodic vacuum arc ion beam techniques may be used to deposit layer 3.

Referring now to FIG. 2, it has been surprisingly been found that buffing (i.e., mechanically rubbing or polishing) DLC inclusive layer 3 after its deposition on substrate 1 (in either the FIG. 1(a) or FIG. 1(b) embodiment) causes the resulting coated article to have improved scratch resistance (SR). Thus, as shown in FIG. 2 steps according to the instant invention include depositing DLC inclusive layer 3 onto substrate 1 (see FIG. 1) in step S1, and thereafter buffing the layer 3 in step S2 which causes SR to improve.

EXAMPLES

The examples set forth below illustrate that buffing the DLC inclusive layer 3 improves SR characteristics of the resulting coated article. Each of the examples below was of the FIG. 1(a) embodiment, where a DLC layer 3 was ion beam deposited directly on the substrate. Examples 1, 2, and 3 utilized buffing of the DLC layer 3 after its ion beam deposition, whereas comparative Examples 1a, 2a and 3a did not utilize such buffing of the DLC layer 3 and thus had less desirable SR characteristics. Scratch resistance (SR) in the table below was measured for each example as the average of five different measurements, all taken at 72 degrees F and 52% humidity in the room. SR was measured on a scale of 1–7 after an attempt was made to scratch the resulting coated article with a piece of soda-lime-silica glass, where the higher the value the more scratch resistant the layer 3 was (i.e., for SR: 1 means easily scratchable as is raw glass; 6 means fairly scratch resistant; and 7 means non-scratchable with soda-lime-silica round piece of glass). SR measurements were taken prior to exposure of the coated articles to significant environmental elements such as UV, rain, etc. In each example, a clear 2 mm thick glass substrate 1 was used, 6"×6" in size. All substrates 1 were washed using neutral detergent (Shaklee-basic H) and air dried. In each of the examples, the DLC layer 3 was ion beam deposited using a single ion beam scan at a linear velocity of 100 inches/minute, 145 sccm acetylene gas, 2970 volts, and 0.57–0.59 amps. Some examples were pre-treated (Pre-treat) by rubbing the glass substrate 1 for about 10 seconds with a denim cloth prior to deposition of the DLC layer 3. Some examples used ion beam milling (Pre-mill) of the glass substrate 1 via 3 ion beam scans after pre-treating but prior to deposition of DLC layer 3; where the milling was carried out at a linear velocity of 100 inches/minute, using 100 sccm Ar gas, at 2970 volts, 0.33 amps. When DLC layer 3 was buffed, it was done by hand for about 10 seconds using denim cloth.

| Example | Pre-treat? | Pre-mill? | DLC layer 3 thick. | Buff DLC layer 3? | SR |
|---|---|---|---|---|---|
| 1 | yes | yes | 17.18 Å | yes | 5.8 |
| 1a | yes | yes | 17.18 Å | no | 5.2 |
| 2 | no | yes | 17.18 Å | yes | 6.6 |
| 2a | no | yes | 17.18 Å | no | 6.0 |
| 3 | yes | no | 14.69 Å | yes | 6.6 |
| 3a | yes | no | 14.69 Å | no | 6.0 |
| 4 | no | no | 14.69 Å | yes | 7.0 |
| 4a | no | no | 14.69 Å | no | 6.6 |

From the data above, it can be seen that buffing DLC layer 3 improves scratch resistance (SR). In examples 1–4, DLC layer 3 was buffed, while in comparative examples 1a–4a DLC layer 3 was not buffed. Note: examples 1 and 1a are to be compared to one another because the only difference therebetween is whether the DLC layer 3 was buffed, while examples 2 and 2a are to be compared to one another because the only difference therebetween is whether the DLC layer 3 was buffed, examples 3 and 3a are to be compared to one another because the only difference therebetween is whether the DLC layer 3 was buffed, and examples 4 and 4a are to be compared to one another because the only difference therebetween is whether the DLC layer 3 was buffed. It can be seen that buffing of the DLC layer cause SR to improve about 0.6 (e.g., in example 1 SR was 5.8 with DLC buffing, and only 5.2 without DLC buffing).

In certain embodiments of this invention, buffing (e.g., rubbing) is carried out on layer 3 to an extent so that SR is improved by at least 3%, more preferably at least 5%, more preferably at least 8%, and most preferably at least 10%. For example, in example 1 above (vs. 1a), the buffing of DLC layer 3 improved SR about 11.54% (i.e., 0.6/5.2=0.1154); and in example 2 above (vs. 2a) the buffing of DLC layer 3 improved SR about 10% (i.e., 0.6/6=0.10).

While each of the above examples of the instant invention involves the use of DLC in layer 3, the instant invention is not so limited. In particular, the instant invention may also be used to improve scratch resistance in other types of layer(s) or coatings by buffing the same.

Also, while buffing of layer 3 was done above using a denim cloth, the instant invention is not so limited. Other forms of buffing may instead be used in different embodiments of this invention. For example, the buffing of layer 3 may be carried out using a nylon brush (e.g., by hand or using a mechanical device such as a drill press), a cotton cloth, with or without cleaning solution such as water and/or soap, or in any other suitable fashion. In any event, in certain embodiments of this invention, buffing (e.g., rubbing) is carried out on layer 3 to an extent such that SR is improved by at least 3%, more preferably at least 5%, more preferably at least 8%, and most preferably at least 10%.

Once given the above disclosure, many other features, modifications, and improvements will become apparent to the skilled artisan. Such other features, modifications, and improvements are, therefore, considered to be a part of this invention, the scope of which is to be determined by the following claims.

What is claimed is:

1. A method of making a coated article, the method comprising:
   depositing a diamond-like carbon (DLC) inclusive coating on a substrate; and
   buffing the DLC inclusive coating to an extent so that scratch resistance of the coating improves at least 3%.

2. The method of claim 1, wherein said buffing the DLC inclusive coating is performed to an extent so that the scratch resistance of the coating improves at least 5%.

3. The method of claim 1, wherein said buffing the DLC inclusive coating is performed to an extent so that the scratch resistance of the coating improves at least 8%.

4. The method of claim 1, wherein said buffing the DLC inclusive coating is performed to an extent so that the scratch resistance of the coating improves at least 10%.

5. The method of claim 1, wherein the coating has an initial contact angle θ of at least about 80 degrees, and an average hardness of at least about 10 GPa.

6. The method of claim 1, wherein the coating has a contact angle θ less than or equal to 15 degrees, and an average hardness of at least about 10 GPa.

7. The method of claim 1, wherein the coating has a contact angle θ less than or equal to 10 degrees, and an average hardness of at least about 20 GPa.

8. The method of claim 1, wherein the coating comprises at least one DLC inclusive layer that has more $sp^3$ carbon-carbon bonds than $sp^2$ carbon-carbon bonds.

9. The method of claim 8, wherein the DLC inclusive layer is the layer which said buffing is performed on.

10. The method of claim 9, wherein the DLC inclusive layer has a density of from about 2.4 to 3.4 $gm/cm^3$.

11. The method of claim 10, wherein the DLC inclusive layer has a density of from about 2.7 to 3.0 $gm/cm^3$.

12. The method of claim 1, wherein said buffing is performed using at least one of a denim cloth and a nylon brush.

13. The method of claim 1, wherein the coating further comprises a layer comprising at least one of Ag and NiCr located on the substrate between the substrate and a layer comprising DLC.

14. The method of claim 1, wherein the substrate comprises glass.

15. A method of making a coated article, the method comprising:
    depositing a diamond-like carbon (DLC) inclusive layer on a substrate; and
    buffing the DLC inclusive layer so that scratch resistance of the DLC inclusive layer improves.

16. The method of claim 15, wherein said buffing the DLC inclusive layer is performed to an extent so that the scratch resistance of the layer improves at least 5%.

17. The method of claim 15, wherein the DLC inclusive layer has a contact angle θ less than or equal to 10 degrees, and an average hardness of at least about 20 GPa.

18. The method of claim 15, wherein the DLC inclusive layer has more $sp^3$ carbon-carbon bonds than $sp^2$ carbon-carbon bonds.

19. The method of claim 15, wherein the DLC inclusive layer further includes at least one of H, F, B and Si.

20. The method of claim 15, further comprising providing a multi-layer IR-reflective layer system on the substrate, and wherein the DLC inclusive layer is deposited on the substrate over the IR-reflective layer system.

21. The method of claim 15, further comprising providing a layer comprising one of Ag and NiCr on the substrate, and wherein the DLC inclusive layer is deposited on the substrate over the layer comprising one of Ag and NiCr.

22. The method of claim 15, wherein the substrate comprises glass.

23. The method of claim 15, wherein the DLC inclusive layer is deposited using ion beam deposition.

24. The method of claim 23, wherein the DLC inclusive layer is deposited using at least acetylene ($C_2H_2$) gas in an ion beam source or deposition apparatus.

* * * * *